(12) United States Patent
Kon et al.

(10) Patent No.: US 11,935,485 B2
(45) Date of Patent: Mar. 19, 2024

(54) DISPLAY DEVICE HAVING A HIDDEN IMAGE DATA ON A LAST SCANNING LINE AND METHOD THEREOF

(71) Applicant: Sony Semiconductor Solutions Corporation, Kanagawa (JP)

(72) Inventors: Chiaki Kon, Kanagawa (JP); Noboru Tanigawa, Fukuoka (JP); Takafumi Nishioka, Fukuoka (JP); Kouichi Hashikaki, Fukuoka (JP); Toshinobu Sekiuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/785,177

(22) PCT Filed: Dec. 7, 2020

(86) PCT No.: PCT/JP2020/045490
§ 371 (c)(1),
(2) Date: Jun. 14, 2022

(87) PCT Pub. No.: WO2021/153008
PCT Pub. Date: Aug. 5, 2021

(65) Prior Publication Data
US 2023/0020794 A1    Jan. 19, 2023

(30) Foreign Application Priority Data
Jan. 27, 2020   (JP) ................................. 2020-010835

(51) Int. Cl.
*G09G 3/3266*    (2016.01)
*G09G 3/3275*    (2016.01)

(52) U.S. Cl.
CPC ......... *G09G 3/3266* (2013.01); *G09G 3/3275* (2013.01); *G09G 2310/0278* (2013.01)

(58) Field of Classification Search
CPC ................................................ G09G 3/3266
(Continued)

(56) References Cited

U.S. PATENT DOCUMENTS

2009/0058782 A1\* 3/2009 Watanabe ............ G09G 3/3614
345/94
2010/0277463 A1\* 11/2010 Yen .......................... G09G 3/20
345/99

(Continued)

FOREIGN PATENT DOCUMENTS

JP    H02-240687 A    9/1990
JP    H07-175452 A    7/1995
(Continued)

OTHER PUBLICATIONS

International Search Report (PCT/ISA/210), International Application No. PCT/JP2020/045490, dated Feb. 9, 2021.

*Primary Examiner* — Long D Pham
(74) *Attorney, Agent, or Firm* — Michael Best & Friedrich LLP (57) ABSTRACT

A display device that includes a plurality of scanning lines, a plurality of data lines, and a pixel unit in which a pixel is specified by the scanning line and the data line, in which image data of one line is simultaneously displayed for a plurality of adjacent scanning lines, image data to be simultaneously displayed is made different between an N frame and an (N+1) frame that are temporally consecutive, and the image data is shifted by one line, and the image data of a last scanning line of at least one of the N frame or the (N+1) frame is hidden.

12 Claims, 5 Drawing Sheets

(58) Field of Classification Search
USPC .......................................................... 345/204
See application file for complete search history.

(56) References Cited

U.S. PATENT DOCUMENTS

| | | | |
|---|---|---|---|
| 2010/0328278 A1* | 12/2010 | Ishiguro | ............... G09G 3/3233 |
| | | | 345/205 |
| 2013/0271501 A1 | 10/2013 | Yang | |
| 2014/0104329 A1 | 4/2014 | Tokumura | |
| 2016/0155405 A1* | 6/2016 | Kim | ...................... G09G 3/003 |
| | | | 345/88 |

FOREIGN PATENT DOCUMENTS

| | | |
|---|---|---|
| JP | 2004-118162 A | 4/2004 |
| JP | 2010-271365 A | 12/2010 |
| JP | 2013-250505 A | 12/2013 |
| WO | 2014/103500 A1 | 7/2014 |

* cited by examiner

N FRAME

| | |
|---|---|
| 1 | 1 |
| 2 | 3 |
| 3 | 5 |
| ⋮ | ⋮ |
| 480 | 959 |
| 481 | 960 |

(N + 1) FRAME

| | |
|---|---|
| 1 | 2 |
| 2 | 4 |
| 3 | 6 |
| ⋮ | ⋮ |
| 480 | 960 |
| 481 | ARBITRARY DATA |

B

N FRAME

| | |
|---|---|
| 1 | 1 |
| 2 | 3 |
| 3 | 3 |
| 4 | 5 |
| ⋮ | ⋮ |
| 958 | 959 |
| 959 | 959 |
| 960 | 960 |
| 961 | |

(N + 1) FRAME

| | |
|---|---|
| 1 | 2 |
| 2 | 2 |
| 3 | 4 |
| 4 | 4 |
| ⋮ | ⋮ |
| 958 | 958 |
| 959 | 960 |
| 960 | 960 |
| 961 | ARBITRARY DATA |

DISPLAY DEVICE HAVING A HIDDEN IMAGE DATA ON A LAST SCANNING LINE AND METHOD THEREOF

TECHNICAL FIELD

The present technology relates to an active matrix-type display device and a method of driving the display device.

BACKGROUND ART

Display devices using an organic light emitting diode (hereinafter referred to as an OLED) element or the like as a light emitting element is known. In a display device, a pixel circuit including a light emitting element, a transistor, and the like is provided corresponding to a pixel at an intersection of a scanning line (gate line) from a vertical scanning circuit and a data line (signal line) from a horizontal scanning circuit. When a data signal having a potential according to a gradation level of a pixel is applied to a gate of the transistor for the pixel circuit, the transistor supplies a current corresponding to a voltage between the gate and a source to the light emitting element, and the light emitting element emits light with luminance according to the gradation level.

Patent Document 1 describes a method of simultaneously driving a plurality of adjacent scanning lines in order to implement a higher frame rate. For example, by simultaneously driving two scanning lines, the time required for scanning one frame is shortened to ½. For example, two adjacent scanning lines are simultaneously driven per horizontal line period. That is, a method of simultaneously driving a line 1 and a line 2 in the first horizontal line period, a line 3 and a line 4 in the second horizontal line period, and a line 5 and a line 6 in the third horizontal line period is conceivable. Since this driving method causes visual deterioration, the invention described in Patent Document 1 performs scanning by simultaneously driving a plurality of scanning lines (lines) in one horizontal line period, and changes a combination of the plurality of scanning lines that are simultaneously driven in a cycle according to a frame cycle. For example, the combination of scanning lines to be simultaneously driven is changed between a state of "1 and 2", "3 and 4", "5 and 6", and the like, and a state of "1", "2 and 3", "4 and 5", and the like.

Patent Document 2 describes an example of a configuration for implementing frame rate conversion processing as described in Patent Document 1. For example, control is performed on the basis of images including line images L1, L3, and L5 of odd-numbered lines such that the line image L1 is written in the first and second lines of a display device within the same horizontal period, the line image L3 is written in the third and fourth lines of the display device within the same horizontal period, and the other line images are similarly written, and the display device displays a display image on the basis of the control. Furthermore, control is performed on the basis of images including line images L2, L4, and L6 of even-numbered lines such that, for example, black information (luminance information is 0) is written in the first line of the display device, the line image L2 is written in the second and third lines of an EL display unit within the same horizontal period, the line image L4 is written in the fourth and fifth lines of the display device within the same horizontal period, and the other line images are similarly written, and the display device displays a display image on the basis of the control.

In this manner, in the display device, scanning drive is performed every two lines on the basis of a line image L of an odd-numbered line of a frame image F and a display image D is displayed, and scanning drive is performed every two lines with one line shifted from the scanning drive regarding the frame image F on the basis of the line image L of an even-numbered line of a frame image Fi generated by interpolation processing and a display image Di is displayed. Then, the display image D and the display image Di are alternately displayed. As a result, an observer observes an average image of the display images D and Di. Since the display image D and the display image Di shifted from each other by one line are alternately displayed, it is possible to suppress a decrease in vertical resolution. In the present specification, a driving method in which two rows are simultaneously scanned and positions of two rows are shifted by one row (one-row shift) in this manner is referred to as "Mars drive".

CITATION LIST

Patent Document

Patent Document 1: Japanese Patent Application Laid-Open No. 2010-271365
Patent Document 1: Japanese Patent Application Laid-Open No. 2013-250505

SUMMARY OF THE INVENTION

Problems to be Solved by the Invention

Usually, a display device is connected to a transmission side (host side) that generates a display image. Conventionally, since the frame conversion processing is performed on the display device side, the display device has been required to have a large-scale memory and circuit. As a result, there is a problem that it is difficult to narrow the frame of the display device. Furthermore, in an OLED, a function (pixel shift) to automatically move and display a display image at regular intervals in order to prevent burning of a panel is known. For pixel shift, a margin area wider than a normal display area (one to several pixels) is set in the vertical direction and/or the horizontal direction. Black level image data is required as pixels to be output for this margin area. Conventionally, it has been necessary to perform processing of inserting the black level data on the transmission side.

Therefore, an object of the present technology is to provide a display device and a method of driving the display device that can eliminate the need to have a large-scale memory and circuit on a display device side and that can eliminate the need to perform processing of inserting black level data in order to perform Mars drive.

Solutions to Problems

The present technology is a display device including a plurality of scanning lines, a plurality of data lines, and a pixel unit in which a pixel is specified by the scanning line and the data line, in which
image data of one line is simultaneously displayed for a plurality of adjacent scanning lines,
image data to be simultaneously displayed is made different between an N frame and an (N+1) frame that are temporally consecutive, and the image data is shifted by one line, and the image data of a last scanning line of at least one of the N frame or the (N+1) frame is hidden.

MODE FOR CARRYING OUT THE INVENTION

Embodiments to be described below are favorable specific examples of the present technology, and various technically favorable limitations are given. However, the scope of the present technology is not limited to these embodiments unless there is a specific description to limit the present technology in the following description. Furthermore, in the following description, the same names and reference numerals indicate the same constituent elements or constituent elements of the same quality, and redundant description will be omitted as appropriate.

Figure 1:
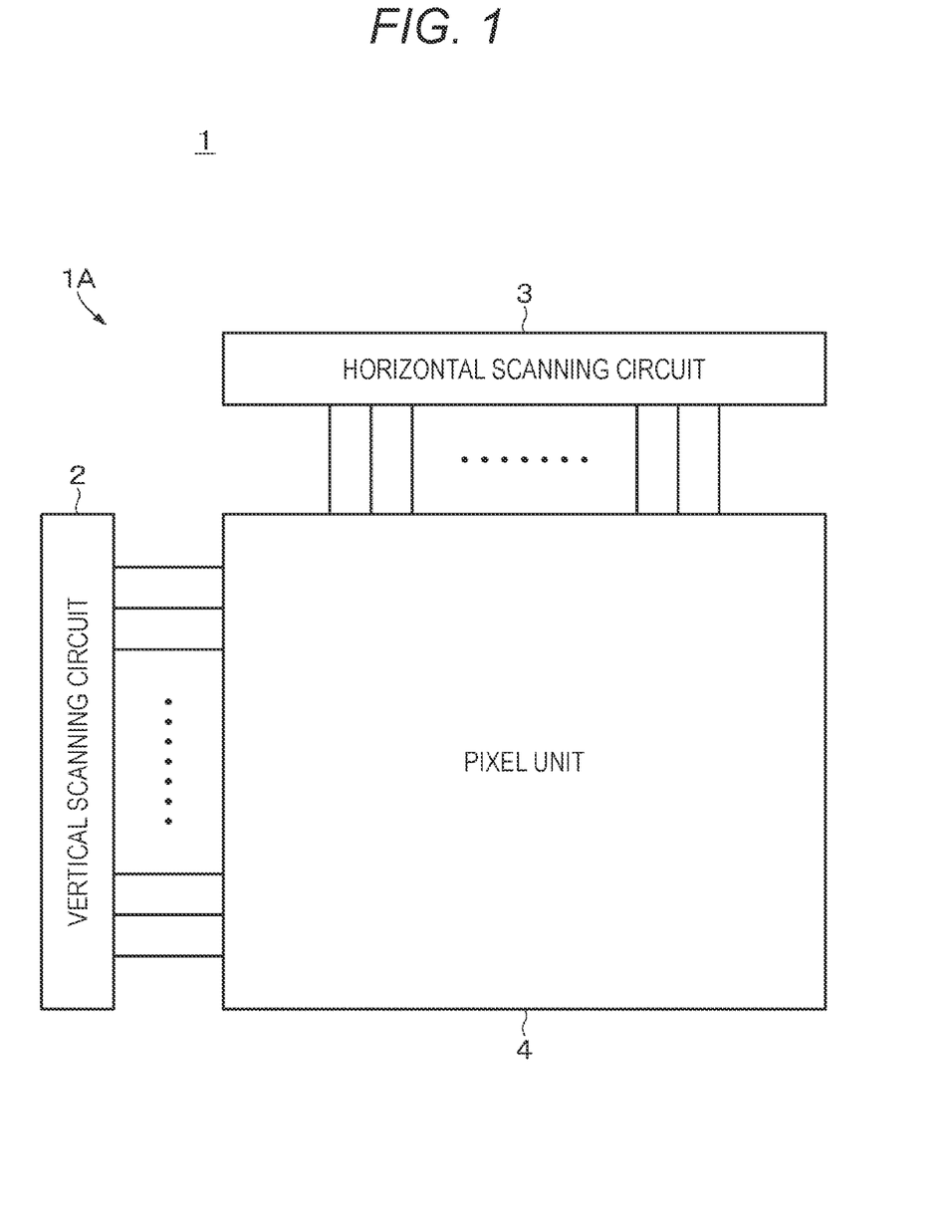
FIG. 1 is a block diagram of an organic EL display device including an active matrix-type drive circuit to which the present technology can be applied.

The present technology can be applied to an organic EL display device 1 (electrooptic device) including an active matrix-type drive circuit illustrated in FIG. 1. The display device 1 includes a display panel 1A and a control circuit that controls an operation of the display panel 1A.

Digital image data is supplied to the display device 1 in synchronization with a data synchronization signal. The image data is data that defines a gradation level of pixels of an image to be displayed on the display panel 1A by, for example, 8 bits. Furthermore, the synchronization signal is a signal including a vertical synchronization signal, a horizontal synchronization signal, and a clock signal. The control circuit generates various control signals on the basis of the synchronization signal and supplies the control signals to the display panel 1A. Furthermore, the control circuit includes a voltage generation circuit. The voltage generation circuit supplies various potentials to the display panel 1A. Moreover, the control circuit generates an analog video signal on the basis of the image data.

As illustrated in FIG. 1, in the display panel 1A, a vertical scanning circuit (scanning line drive circuit) 2, a horizontal scanning circuit (data line drive circuit) 3, and a pixel unit 4 are formed on a semiconductor substrate, for example, a silicon substrate. A plurality of scanning lines from the vertical scanning circuit 2 is extended in a horizontal direction to the pixel unit 4, and a plurality of data lines from the horizontal scanning circuit 3 is extended in a vertical direction. Pixel circuits are connected in a matrix form to the data lines extending in the vertical direction and the scanning lines extending in the horizontal direction. The pixel circuit is provided with pixel circuits (subpixel circuits) corresponding to pixels of three primary colors of red (R), green (G), and blue (B). These three pixels represent one dot of a color image.

The above-described vertical scanning circuit 2 performs vertical scanning by an address scanning method. That is, an arbitrary scanning line is appropriately selected according to scanning line address information from a display control circuit. In an embodiment of the present technology, two or more adjacent scanning lines, for example, two scanning lines are simultaneously selected. By such driving, two-scanning line simultaneous scanning (two-row simultaneous drive or two-row simultaneous write) can be performed.

Figure 2:
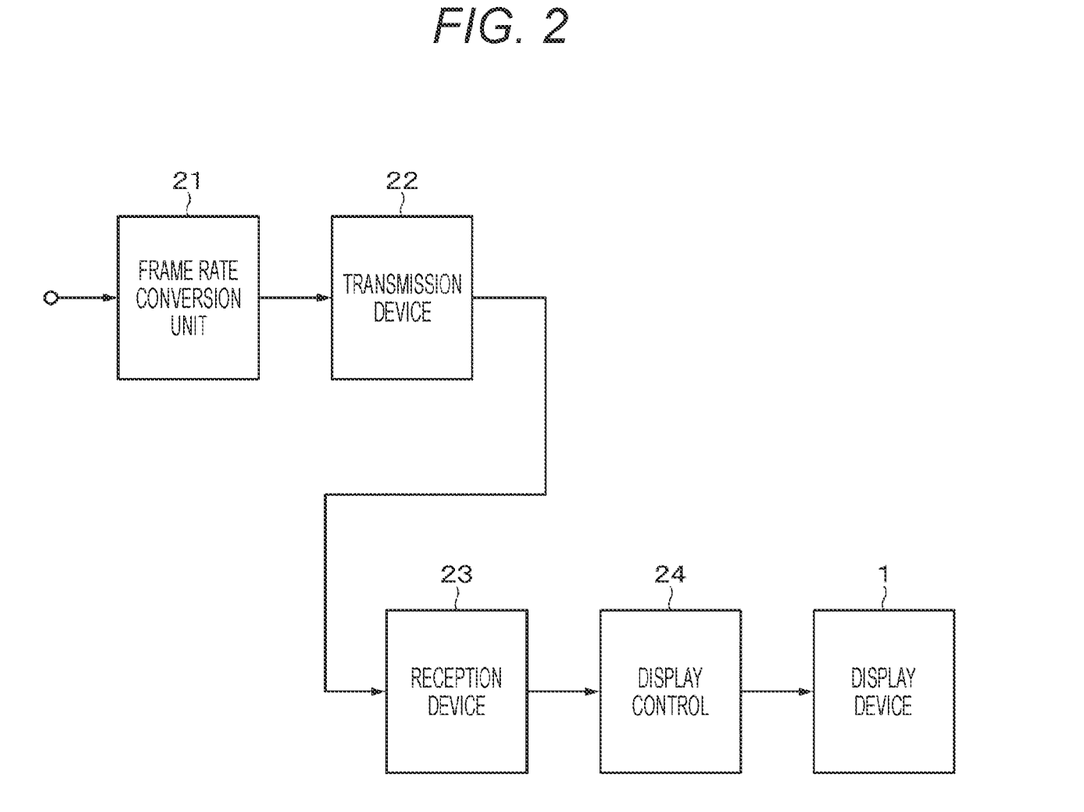
FIG. 2 is a block diagram illustrating a schematic configuration of an embodiment of the present technology.

FIG. 2 is a schematic block diagram of a configuration including a transmission side and a reception side. The image data is supplied to a frame rate conversion unit 21, a frame rate is doubled, and line thinning is performed. For example, an Nth frame (simply referred to as an N frame) and an (N+1)th frame (simply referred to as an (N+1) frame) are formed from progressive image data of 60 frames per second. The N frame includes image data of odd-numbered lines, and the (N+1) frame includes image data of even-numbered lines. The frame rate conversion unit 21 includes, for example, a frame memory. Note that the method of the frame rate conversion processing is not limited to the above-described method, and other methods are possible. For example, an interpolated frame of output data may be created using two consecutive frames of input data.

Figure 3:
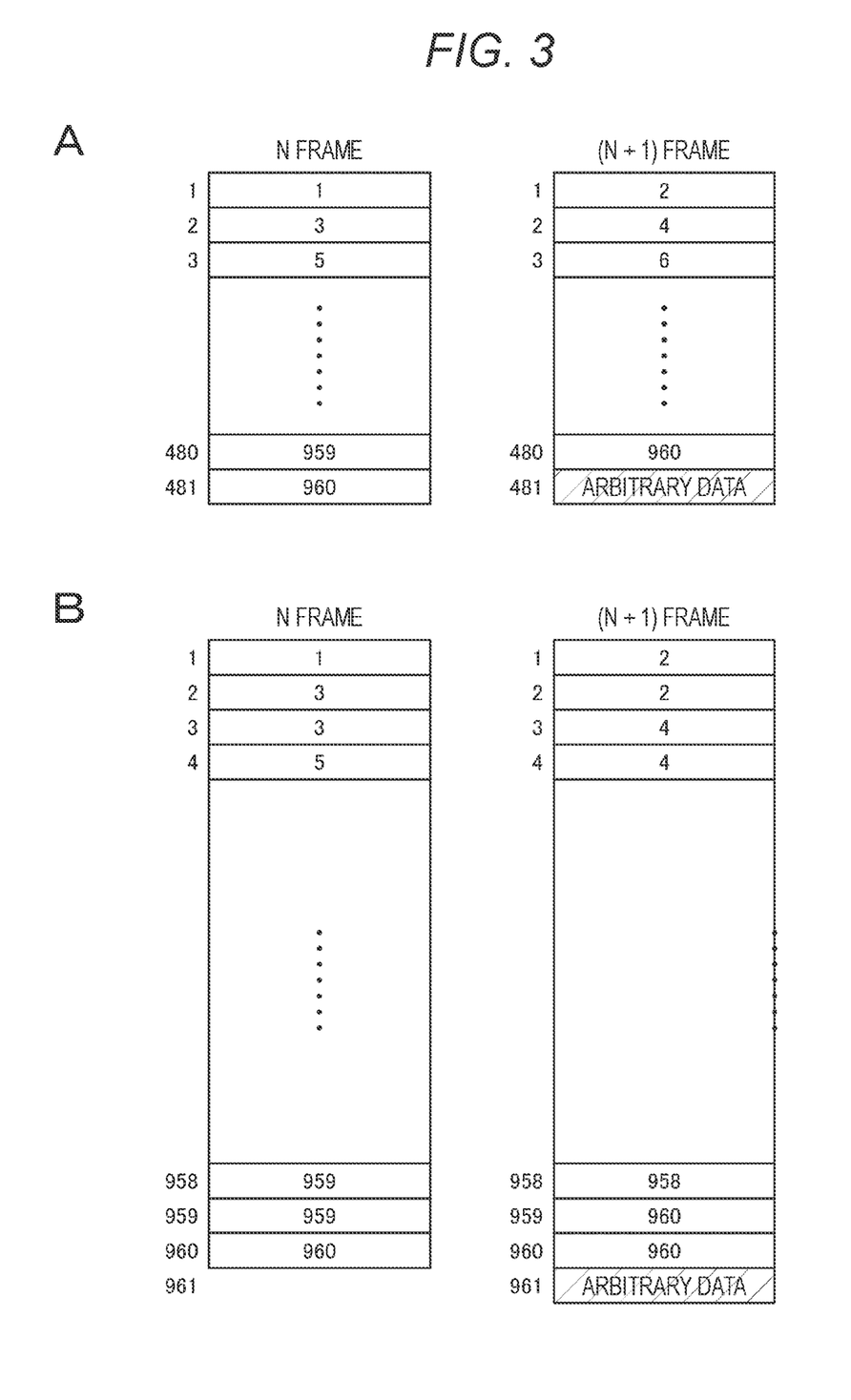
FIG. 3 is schematic diagrams used to describe a method of driving the display device.

As illustrated in FIG. 3A, an image of the N frame including data of 480 scanning lines including data of odd-numbered lines (1, 3, 5, . . . , and 959) from original video data of 960 lines (video data of the first line to video data of the 960th line) and data of 481st scanning line (data of the 960th line) is formed. Similarly, an image of the (N+1) frame including data of 480 scanning lines including data of even-numbered lines (2, 4, 6, . . . , and 960) from the original video data of 960 lines (video data of the first line to video data of the 960th line) and data (arbitrary data) of 481st scanning line is formed. The data of the 481st scanning line is data of the scanning line constituting a margin area of pixel shift.

The N frame and the (N+1) frame have a frame rate (120 frames per second) that is twice the frame rate of the original image data. Conventionally, black level data has been inserted as arbitrary data on the transmission side, but such processing is unnecessary in an embodiment of the present technology. Note that FIG. 3 illustrates a relationship between numbers of the scanning lines and line numbers of the image data arranged (displayed) therein, and the length in the horizontal direction of the image is ignored.

The video data with the converted frame rate is transmitted from a transmission device 22 to a reception device 23. The transmission device 22 and the reception device 23 constitute an interface between a video sending side and a display device side. Output video data of the reception device 23 is supplied to the above-described display device 1 via a display control unit 24.

In the display device 1, Mars drive (two-scanning line simultaneous drive) is performed under the control of the display control unit 24. As illustrated in FIG. 3B, in Mars drive, two-scanning line simultaneous drive is performed, and one-scanning line shift (one-scanning line shift) of the positions of the two scanning lines is performed. In the N frame, the first scanning line is specified, and the video data of the first line is displayed on the first scanning line. Two-scanning line simultaneous drive is performed for the next second and subsequent scanning lines. That is, the video data of the third line is simultaneously displayed by the second and third scanning lines. Hereinafter, the two-scanning line simultaneous drive is performed, and the video data of the last line (960th line) of the (N+1) frame is displayed on the 960th scanning line.

In the next (N+1) frame, two-scanning line simultaneous drive is performed without performing one-scanning line shift. That is, the video data of the second line is simultaneously displayed on the first and second scanning lines, and the video data of the next fourth line is simultaneously displayed on the third and fourth scanning lines. Hereinafter, similarly, the video data of each even-numbered line is simultaneously displayed on two scanning lines. The video data of the last line (960th line) of the (N+1) frame is displayed on the 959th and 960th scanning lines. Moreover, arbitrary data is arranged on the 961st scanning line (the scanning line included in the margin area). In Mars drive, panel response speed can be doubled. Moreover, resolution of the image in the vertical direction can be improved.

A configuration in which arbitrary data is arranged on the 961st scanning line of the (N+1) frame and black is displayed on the display device 1 without inserting black level data will be described.

Figure 4:
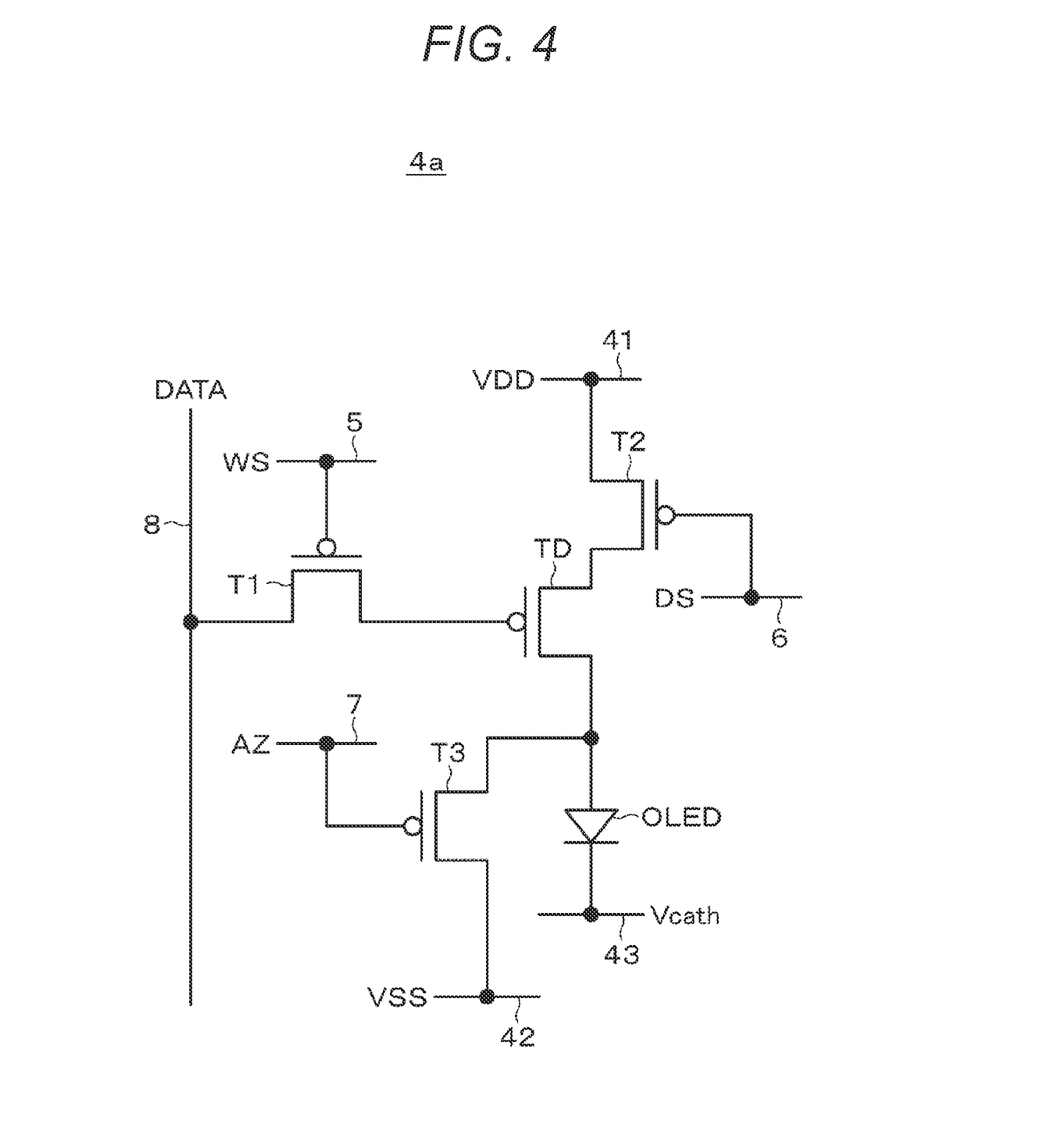
FIG. 4 is a connection diagram illustrating a configuration example of a pixel circuit to which the present technology can be applied.

FIG. 4 illustrates a configuration of an example of a pixel circuit 4a of one pixel of the pixel unit 4 of the display device 1. The pixel circuit 4a is connected to a first signal line 5, a second signal line 6, and a third signal line 7 from the vertical scanning circuit 2, and a data line 8 from the horizontal scanning circuit 3. The pixel circuit 4a includes four transistors (a drive transistor TD, a transistor T1, a transistor T2, and a transistor T3). For example, a P-channel transistor is used as the four transistors.

The drive transistor TD has a source connected to a feeder line 41 via the transistor T2 and a drain connected to an anode of an OLED, and controls a current flowing through the OLED. A high-potential power supply (VDD) is fed to the feeder line 41. A cathode of the OLED is connected to a power supply line 42 maintained at a potential VSS that is a low level side of the power supply.

The transistor T1 (first transistor) has a gate connected to the first signal line 5, one of a source and a drain connected to the data line 8, and the other connected to a gate of the drive transistor TD. The transistor T1 writes a data line potential (gradation potential) to the gate of the drive transistor TD in response to a write scanning signal WS.

The transistor T2 (second transistor) has a gate connected to the second signal line 6, one of a source and a drain connected to the feeder line 41, and the other connected to the source of the drive transistor TD, and controls power supply to the drive transistor TD.

The transistor T3 (third transistor) has a gate connected to the third signal line 7, one of a source and a drain connected to the drain of the drive transistor TD and the anode of the OLED, and the other connected to the power supply line 42. The power supply line 42 is set to a low potential power supply (VSS). Note that the drain of the transistor T3 and the cathode of the OLED may be connected to the same power supply line.

In each pixel circuit 4a, light emission luminance of the OLED is controlled by the current controlled by the drive transistor TD. Therefore, when a threshold voltage of the drive transistor TD varies in each pixel circuit 4a, the light emission luminance varies for each pixel, and uniformity of the screen is impaired. Therefore, a threshold voltage correction operation for reducing the variation in the light emission luminance caused by the variation in the threshold voltage of the drive transistor TD is performed with line sequential scanning.

A period for correcting the threshold voltage of the drive transistor TD includes a threshold voltage correction preparation period and a threshold voltage correction period. The threshold voltage correction preparation refers to initializing a gate voltage of the drive transistor TD and initializing a source voltage of the drive transistor TD. The threshold voltage correction refers to a correction operation of bringing a gate-source voltage of the drive transistor TD close to the threshold voltage of the drive transistor TD. A write voltage is switched from a reference voltage to a signal voltage within the threshold voltage correction period, and the processing shifts to a signal write period.

To set a pixel to a black display state, normally, a black display potential is written in the data line 8. In an embodiment of the present technology, a signal AZ is set to a low level. As a result, the transistor T3 is set to an on state, a drive current stops flowing through the OLED, and the black display state can be obtained. Therefore, the processing of writing the black display potential is unnecessary.

Figure 5:
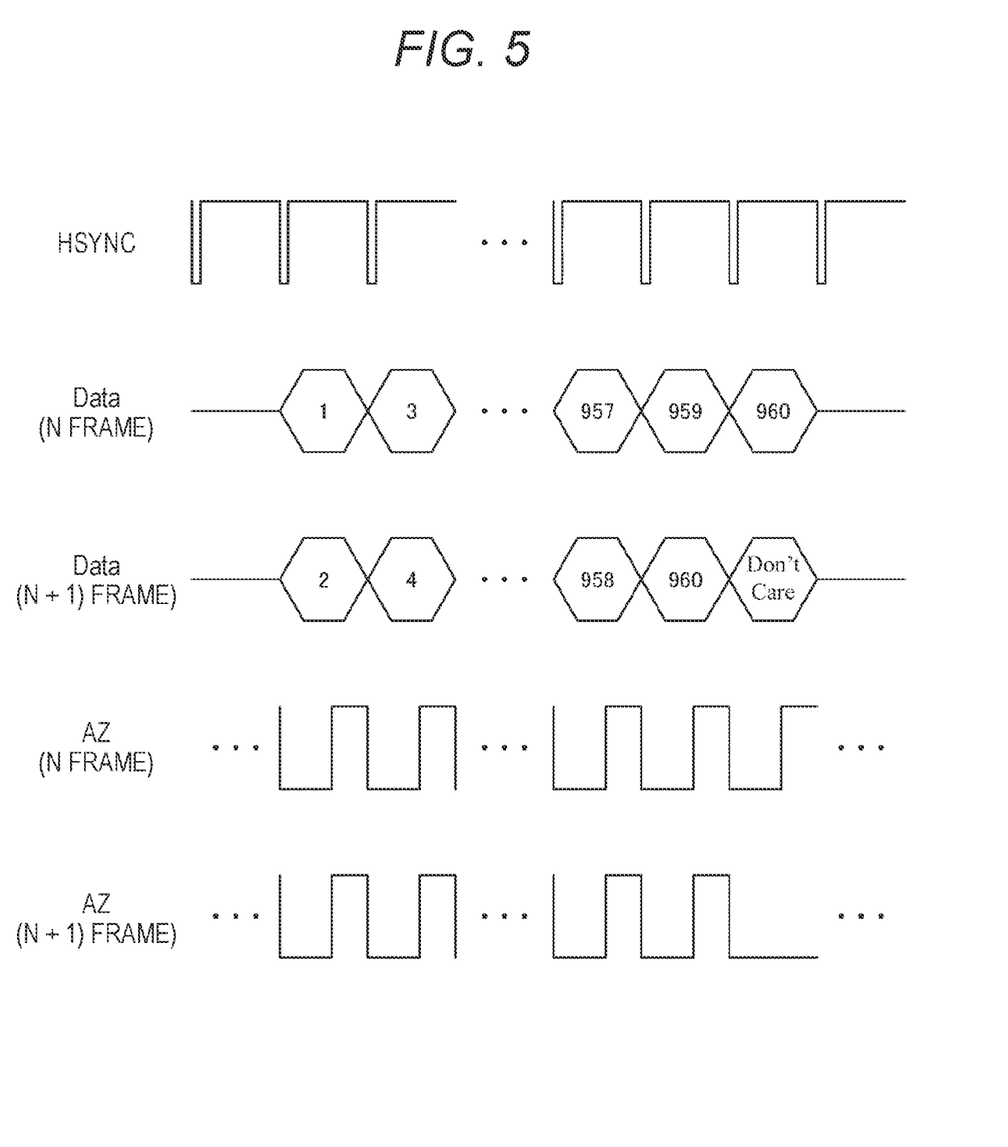
FIG. 5 is a timing chart for describing a method of driving a pixel circuit according to an embodiment of the present technology.

FIG. 5 illustrates a horizontal synchronization signal HSYNC, the video data of the N frame, the video data of the (N+1) frame, a drive signal AZ of the N frame, and a drive signal AZ of the (N+1) frame. Information for identifying the N frame and the (N+1) frame is added to the video data from the reception side. The data of the last line of the (N+1) frame is arbitrary data. In a case where this arbitrary data is displayed, the drive signal AZ maintains a low-level state. As a result, the transistor T3 remains in the ON state, and the OLED enters an extinction state. By such a driving method, it is possible to eliminate the need for processing of writing black data.

Next, an electronic device to which an electrooptic device according to an embodiment or the like or an application example is applied will be described. Electrooptic devices are suitable for applications in which pixels are small in size and high definition display is performed. Therefore, the present invention can be applied to a display device such as a head-mounted display, smart glasses, a smartphone, or an electronic viewfinder of a digital camera as the electronic device.

The embodiments of the present technology have been specifically described. However, the present technology is not limited to the above-described embodiments, and various modifications based on the technical idea of the present technology can be made. For example, various modifications to be described below can be made. Furthermore, one or a plurality of arbitrarily selected modes of the modifications to be described below can be appropriately combined. Furthermore, the configurations, methods, steps, shapes, materials, numerical values, and the like given in the above-described embodiments can be combined with one another without departing from the gist of the present technology. For example, the numerical value such as the number of scanning lines in the vertical direction of the display device is an example and may be another number of scanning lines. Furthermore, a plurality of scanning lines may be increased for pixel shift. Moreover, pixel shift may be performed in the horizontal direction.

Note that the present technology can also have the following configurations.

(1)

A display device including a plurality of scanning lines, a plurality of data lines, and a pixel unit in which a pixel is specified by the scanning line and the data line, in which image data of one line is simultaneously displayed for a plurality of adjacent scanning lines, image data to be simultaneously displayed is made different between an N frame and an (N+1) frame that are temporally consecutive, and the image data is shifted by one line, and the image data of a last scanning line of at least one of the N frame or the (N+1) frame is hidden.

(2)

The display device according to (1), in which a margin area is set outside an area where normal display is performed, and the last scanning line forms the margin area.

(3)

The display device according to (1) or (2), in which the image data of the last scanning line is hidden by driving a switching element that brings a light emitting element into an extinction state.

(4)

The display device according to (3), in which the light emitting element is an OLED, and the switching element is connected in parallel with between an anode and a cathode of the OLED.

(5)

The display device according to any one of (1) to (3), in which input image data is a progressive signal with a converted frame rate, the progressive signal includes the image data of the N frame including image data of odd-numbered lines and the image data of the (N+1) frame including image data of even-numbered lines, and the image data of the last scanning line of one of the N frame or the (N+1) frame is arbitrary data.

(6)

A method of driving a display device including a plurality of scanning lines, a plurality of data lines, and a pixel unit in which a pixel is specified by the scanning line and the data line, in which image data of one line is simultaneously displayed for a plurality of the adjacent scanning lines, image data to be simultaneously displayed is made different between an N frame and an (N+1) frame that are temporally consecutive, and the image data is shifted by one line, and the image data of the last scanning line of at least one of the N frame or the (N+1) frame is hidden.

REFERENCE SIGNS LIST

1 Organic EL display device
2 Vertical scanning circuit
3 Horizontal scanning circuit
4 Pixel unit
4a Pixel circuit
8 Data line
TD Drive transistor
OLED Light emitting element
21 Frame rate conversion unit
24 Display control unit

The invention claimed is:

1. A display device comprising:
a plurality of scanning lines, a plurality of data lines, and a pixel unit in which a pixel is specified by the scanning line and the data line, wherein
image data of one line is simultaneously displayed for a plurality of adjacent scanning lines,
image data to be simultaneously displayed is made different between an N frame and an (N+1) frame that are temporally consecutive, and the image data is shifted by one line, and
the image data of a last scanning line of at least one of the N frame or the (N+1) frame is hidden by driving a switching element that brings a light emitting element into an extinction state.

2. The display device according to claim 1, wherein a margin area is set outside an area where normal display is performed, and the last scanning line forms the margin area.

3. The display device according to claim 1, wherein the light emitting element is an OLED, and the switching element is connected in parallel with between an anode and a cathode of the OLED.

4. The display device according to claim 1, wherein
input image data is a progressive signal with a converted frame rate,
the progressive signal includes the image data of the N frame including image data of odd-numbered lines and the image data of the (N+1) frame including image data of even-numbered lines, and
the image data of the last scanning line of one of the N frame or the (N+1) frame is arbitrary data.

5. A method of driving a display device including a plurality of scanning lines, a plurality of data lines, and a pixel unit in which a pixel is specified by the scanning line and the data line, the method comprising:
simultaneously displaying image data of one line for a plurality of the adjacent scanning lines,
wherein image data to be simultaneously displayed is made different between an N frame and an (N+1) frame that are temporally consecutive, and the image data is shifted by one line, and
the image data of the last scanning line of at least one of the N frame or the (N+1) frame is hidden by driving a switching element that brings a light emitting element into an extinction state.

6. The method according to claim 5, wherein a margin area is set outside an area where normal display is performed, and the last scanning line forms the margin area.

7. The method according to claim 5, wherein the light emitting element is an OLED, and the switching element is connected in parallel with between an anode and a cathode of the OLED.

8. The method according to claim 5, wherein
input image data is a progressive signal with a converted frame rate,
the progressive signal includes the image data of the N frame including image data of odd-numbered lines and the image data of the (N+1) frame including image data of even-numbered lines, and
the image data of the last scanning line of one of the N frame or the (N+1) frame is arbitrary data.

9. A non-transitory computer readable medium storing a program that, when executed by a computer included in a display device having a plurality of scanning lines, a plurality of data lines, and a pixel unit in which a pixel is specified by the scanning line and the data line, causes the computer to perform a set of operations comprising:
simultaneously displaying a plurality of data lines, and a pixel unit in which a pixel is specified by the scanning line and the data line, image data of one line for a plurality of the adjacent scanning lines,
wherein image data to be simultaneously displayed is made different between an N frame and an (N+1) frame that are temporally consecutive, and the image data is shifted by one line, and the image data of the last scanning line of at least one of the N frame or the (N+1) frame is hidden by driving a switching element that brings a light emitting element into an extinction state.

10. The non-transitory computer readable medium according to claim 9, wherein a margin area is set outside an area where normal display is performed, and the last scanning line forms the margin area.

11. The non-transitory computer readable medium according to claim 9, wherein the light emitting element is an OLED, and the switching element is connected in parallel with between an anode and a cathode of the OLED.

12. The non-transitory computer readable medium according to claim 9, wherein
- input image data is a progressive signal with a converted frame rate,
- the progressive signal includes the image data of the N frame including image data of odd-numbered lines and the image data of the (N+1) frame including image data of even-numbered lines, and
- the image data of the last scanning line of one of the N frame or the (N+1) frame is arbitrary data.

* * * * *